United States Patent
Perea (10) Patent No.: US 9,822,834 B2
(45) Date of Patent: Nov. 21, 2017

(54) SYSTEM AND METHOD FOR CERAMIC DOPING OF CARBON FIBER COMPOSITE STRUCTURES

(71) Applicant: Goodrich Corporation, Charlotte, NC (US)

(72) Inventor: Paul Perea, Pueblo West, CO (US)

(73) Assignee: GOODRICH CORPORATION, Charlotte, NC (US)

( * ) Notice: Subject to any disclaimer, the term of this patent is extended or adjusted under 35 U.S.C. 154(b) by 302 days.

(21) Appl. No.: 14/527,457

(22) Filed: Oct. 29, 2014

(65) Prior Publication Data

US 2016/0123416 A1    May 5, 2016

(51) Int. Cl.
| | |
|---|---|
| *C23C 16/56* | (2006.01) |
| *F16D 65/12* | (2006.01) |
| *C23C 16/26* | (2006.01) |
| *C04B 35/76* | (2006.01) |
| *C04B 35/83* | (2006.01) |
| *F16D 69/02* | (2006.01) |

(52) U.S. Cl.
CPC ............ *F16D 65/126* (2013.01); *C04B 35/76* (2013.01); *C04B 35/83* (2013.01); *C23C 16/26* (2013.01); *C23C 16/56* (2013.01); *F16D 65/127* (2013.01); *F16D 69/023* (2013.01); *C04B 2235/3217* (2013.01); *C04B 2235/5248* (2013.01); *C04B 2235/606* (2013.01); *C04B 2235/614* (2013.01); *C04B 2235/616* (2013.01); *F16D 2200/0052* (2013.01); *F16D 2200/0082* (2013.01); *F16D 2250/0053* (2013.01)

(58) Field of Classification Search
None
See application file for complete search history.

(56) References Cited

U.S. PATENT DOCUMENTS

| | | | |
|---|---|---|---|
| 5,296,311 A | * | 3/1994 | McMurtry ............ C04B 35/573 428/388 |
| 5,962,135 A | | 10/1999 | Walker et al. |
| 2003/0022783 A1 | * | 1/2003 | DiChiara, Jr. ........ C04B 35/111 501/127 |

(Continued)

FOREIGN PATENT DOCUMENTS

| | | |
|---|---|---|
| WO | 2008075055 | 6/2008 |
| WO | 2012066352 | 5/2012 |

OTHER PUBLICATIONS

Extended European Search Report dated Mar. 10, 2016 in European Application No. 15191965.1.

(Continued)

*Primary Examiner* — Joseph Miller, Jr.
(74) *Attorney, Agent, or Firm* — Snell & Wimer, L.L.P.

(57) ABSTRACT

A system and method for ceramic doping of carbon fiber materials is disclosed. A carbon fiber preform may be made of carbonized oxidized PAN fibers and may be placed in contact with a nanoparticle suspension having nanoparticles and a dispersion medium. The nanoparticles may impregnate the carbon fiber preform, causing it to become a doped carbon fiber preform. The doped carbon fiber preform may be densified. The doped carbon fiber preform may be densified by conventional CVI processing techniques. The doped carbon fiber preform may be densified by thermal gradient CVI.

8 Claims, 5 Drawing Sheets

(56) References Cited

U.S. PATENT DOCUMENTS

2005/0178327 A1    8/2005  Rudolph et al.
2010/0015332 A1*  1/2010  Rollin ..................... C04B 35/83
                                                                427/228

OTHER PUBLICATIONS

Colloidal Alumina: "Data Sheet Nyacol AL20, AL20DW," Apr. 1, 2015, retrieved from http://www.nyacol.com/app/uploads/2015/04/AL20-AL20DW-Binder-Data-Sheet-20130528.pdf.

* cited by examiner

SYSTEM AND METHOD FOR CERAMIC DOPING OF CARBON FIBER COMPOSITE STRUCTURES

FIELD

The present disclosure relates to the field of composite structures, and more specifically, to ceramic doping of composite structures, such as carbon fiber composite structures.

BACKGROUND

Carbon fiber parts, such as carbon/carbon parts ("C/C") in the form of friction disks are commonly used for aircraft brake disks and, particularly in automotive racing brake and clutch disks. Carbon/carbon brake disks are especially useful in these applications because of the high temperature characteristics of C/C material. However, limitations of traditional C/C material include the limited wear life of the C/C material, the tendency to oxidize at high temperatures, and the significant manufacturing time required.

SUMMARY OF THE INVENTION

A method of processing a carbon fiber preform is disclosed. The method may include exposing the carbon fiber preform including carbonized oxidized PAN fibers to a nanoparticle suspension including nanoparticle dispersion having a nanoparticle and a dispersion medium. The method may include impregnating the nanoparticle into the carbon fiber preform, whereby the carbon fiber preform is converted into a doped carbon fiber preform, and drying the doped carbon fiber preform at a first temperature whereby the dispersion medium is removed from the doped carbon fiber preform.

A doped carbon fiber preform is also provided. The doped carbon fiber preform may include a carbon fiber preform including carbonized oxidized PAN fibers, and nanoparticles impregnated into the carbonized oxidized PAN fiber.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from the scope of the appended claims.

For the sake of brevity, conventional techniques for manufacturing and construction may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical method of construction.

The carbon/carbon material used in C/C parts is a good conductor of heat and is able to dissipate heat generated during braking away from the braking surfaces. Carbon/carbon material is also highly resistant to heat damage, and thus, is capable of sustaining friction between brake surfaces during severe braking without a significant reduction in the friction coefficient or mechanical failure. However, C/C material has limited wear life, a tendency to oxidize at high temperatures, and is associated with significant manufacturing time.

In general, C/C parts produced using the oxidized PAN fiber, carbonization, and CVI densification method are made in successive manufacturing steps. First, a fibrous preform is made utilizing a variety of textile manufacturing techniques. In general, there are currently two primary methods of manufacturing C/C materials. The first method involves the layup and cure of a carbon fiber, phenolic resin matrix composite, followed by pyrolysis and subsequent phenolic resin infiltration and pyrolysis cycles. Multiple resin infiltration and pyrolysis cycles are typically used until the part achieves the desired density. The second method involves fabrication of an oxidized polyacrylonitrile (PAN) fiber ("OPF") or carbon fiber preform, followed by carbonization and chemical vapor infiltration (CVI) densification. The chemical vapor infiltration cycles are continued, in conjunction with machining the preform between infiltration cycles if desired, until the desired part density is achieved. Combinations of these two basic process methods are also in use and may include variations in preform architecture, infiltration resin type, and chemical vapor infiltration conditions.

Typically, the fibrous preform is formed by superimposing a number of fibrous layers on top of each other. The fibrous layers are usually made from OPF. The fibrous layers may be made in a variety of ways and may include discrete (staple) or continuous fibers, unidirectional or cross-layered fibers or braided structures. The fibrous layers may also be preprocessed in various ways, such as pre-needling processes, to make the fibrous layers more coherent.

Preferably, the fibrous layers are placed on top of each other. After each fibrous layer is placed on top of the stack of fibrous layers, the stack is needled. Needling pulls fibers from the in-plane direction and forces them into the z direction, thus decreasing in-plane fiber content which may reduce high-energy friction performance and in-plane mechanical strength in the final composite. In general, the needling process has the effect of interlocking the individual fabric layers together. Thus, after needling, the fibrous preform has fibers extending in three different directions (i.e., in the x and y directions in the plane of the fibrous layers and the z direction perpendicular to the fibrous layers).

After the fibrous preform is made, it is carbonized to convert the OPF into carbon fibers. Typically, fibrous preforms are carbonized by placing the preforms in a furnace with an inert atmosphere. In general, the carbonization process involves heating the fibrous preforms in a furnace to a temperature greater than about 1,600 degrees Celsius (2912 Fahrenheit). Typically, an inert atmosphere of nitrogen, argon or a vacuum is provided in the furnace during the carbonization process. The heat of the furnace causes a chemical conversion of the OPF that converts the fibers to carbon fibers and drives off other chemicals. Although it is preferred that the fibers in the carbonized preform be 100% carbon fiber, it is generally acceptable for a slightly less than full conversion to take place, and the resulting carbon fiber may be as low as 99.5% carbon. The resulting preform generally has the same fibrous structure as the fibrous preform before carbonizing. During carbonization, the total mass and the total fiber volume in each fibrous preform is typically reduced due to the loss of non-carbon compounds. In further embodiments, compressive pressure may be applied to the fibrous preforms during the carbonization process to increase the fiber volume ratio of the fibrous preforms after carbonization, but without changing the z-fiber content.

The pore size and pore volume of the porous structure (e.g., carbonized preform) should be sufficient to permit a gas to infiltrate the pores under reaction conditions and form a solid residue or matrix therein as a result of thermal decomposition.

After the preform has been carbonized, the preform is densified. In general, densification involves filling the voids, or pores, of the fibrous preform with additional carbon material. This may be done using the same furnace used for carbonization or a different furnace. Typically, chemical vapor infiltration and deposition ("CVI/CVD") techniques are used to densify the porous fibrous preform with a carbon matrix. This commonly involves heating the furnace and the carbonized preforms, and flowing hydrocarbon gases into the furnace and around and through the fibrous preforms. As a result, carbon from the hydrocarbon gases separates from the gases and is deposited on and within the fibrous preforms. When the densification step is completed, the resulting C/C part has a carbon fiber structure with a carbon matrix infiltrating the fiber structure, thereby deriving the name "carbon/carbon."

Between the steps of carbonizing and densification, a ceramic doping step may be carried out. As one may appreciate, a carbon fiber preform (e.g., a fibrous preform that has been carbonized, but has not yet been densified) may be desired to be impregnated with another material to alter the material properties of the final product, such as a brake disc. For instance, the density, temperature tolerance, coefficient of friction, tendency to resist oxidation, strength, and other factors of the final brake disc may be altered and/or enhanced.

Figure 1:
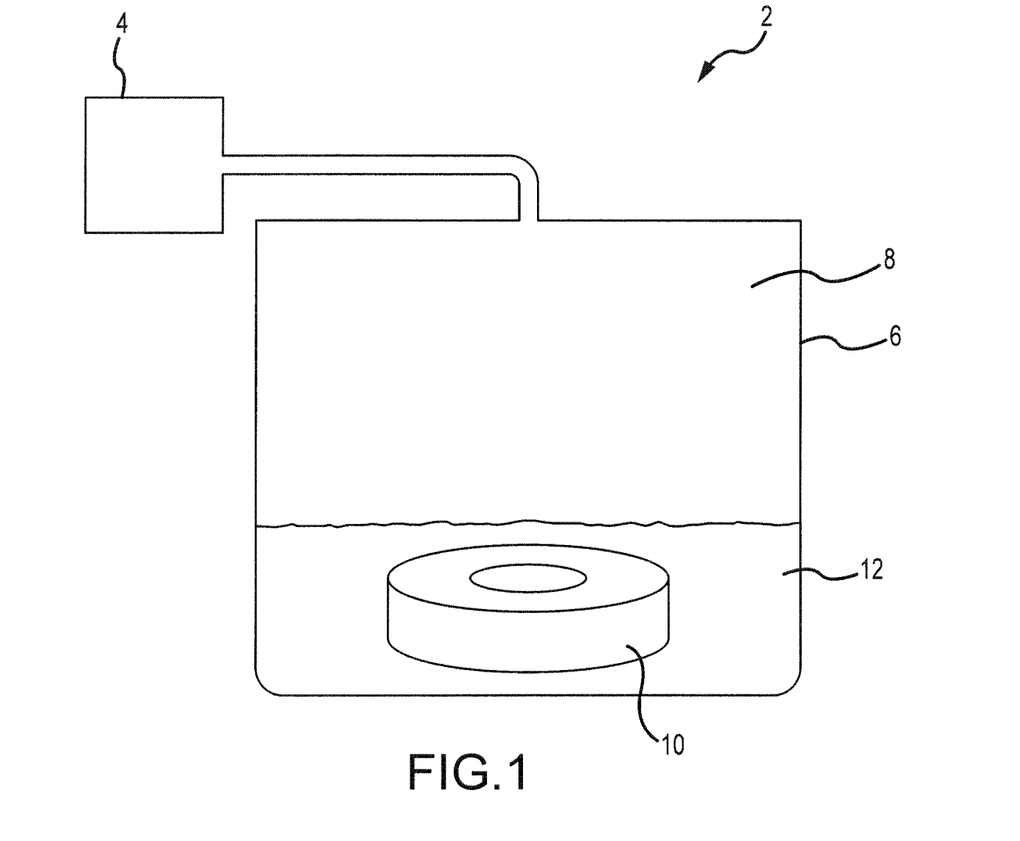
FIG. 1 comprises a diagram of an example system for ceramic doping, in accordance with various embodiments.

Thus, a system and method for ceramic doping is disclosed. With reference to FIG. 1, a doping system 2 may include any system by which a nanoparticle dopant may be impregnated into a carbon fiber preform 10. For example, a doping system 2 may comprise a vacuum source 4, and a vacuum chamber 6. The vacuum source 4 may be in fluidic communication with the vacuum chamber 6 and may exert a selectably variable vacuum pressure on the vacuum chamber 6 and its contents by varying the characteristics of a vacuum atmosphere 8 within the vacuum chamber. The doping system 2 may further comprise a carbon fiber preform 10 and a nanoparticle suspension 12. With momentary reference to FIGS. 1 and 2A, the carbon fiber preform 10 may be positioned inside the vacuum chamber 6 and may be submerged in the nanoparticle suspension 12. With momentary reference to FIG. 2B, in various embodiments, the carbon fiber preform 10 is not submerged in the nanoparticle suspension 12 but rather rests in a partial bath of the nanoparticle suspension 12. With renewed reference to FIG. 1, a vacuum atmosphere 8 comprising one or more gases may be further be disposed within the vacuum chamber 6. The pressure of the vacuum atmosphere 8 may be varied by the vacuum source 4. Similarly, in various embodiments, the gaseous composition of the vacuum atmosphere 8 may be varied by the vacuum source 4. As such, the vacuum source 4 may exert a selectably variable vacuum pressure on the vacuum chamber 6, in response to selectably varying the pressure of the one or more gas comprising the vacuum atmosphere 8. In various embodiments, the vacuum source 4 may selectably decrease the gas pressure of the vacuum atmosphere 8. In various embodiments, in response to the gas pressure decreasing, nanoparticles in the nanoparticle suspension 12 infiltrate the carbon fiber preform 10, doping the carbon fiber preform 10 as further discussed herein.

In various embodiments, the vacuum source 4 may comprise a pump. For instance, the vacuum source 4 may comprise a vacuum pump, whereby air and/or other gas within a chamber, for example, the vacuum chamber 6, may be substantially evacuated. However, vacuum source 4 may comprise any apparatus whereby the ambient pressure inside the vacuum chamber 6 may be reduced below that of the external atmosphere, as desired.

In various embodiments, the vacuum chamber 6 may comprise a sealed vessel. For instance, the vacuum chamber 6 may comprise a gas-tight container. A carbon fiber preform 10 and a nanoparticle suspension 12 may be placed inside the vacuum chamber 6 so that a doping process further discussed herein may occur. However, in various embodiments, the doping process occurs at or near ambient atmospheric pressure, so that the vacuum chamber 6 may not be a gas-tight container. In such embodiments in which the doping process occurs at or near ambient atmospheric pressure, the vacuum source 4 may be omitted.

The carbon fiber preform 10 may comprise a preform processed as discussed herein. The carbon fiber preform 10 may comprise a preform that has proceeded through the step of carbonizing, but has not proceeded through the step of densification, discussed above. Alternatively, a carbon fiber preform 10 may comprise any preform or other structure desired to be impregnated with nanoparticles.

Figure 2A:
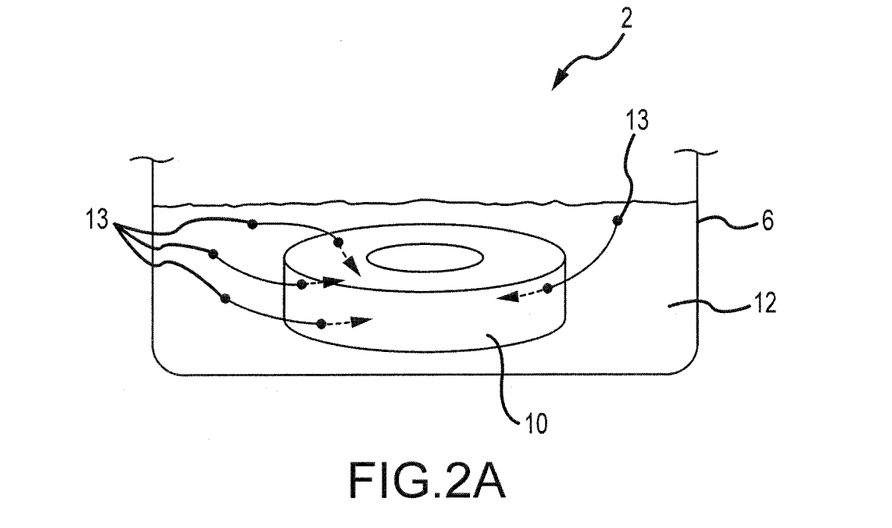
FIG. 2A comprises a detail view of various aspects of an example system for ceramic doping, including a carbon fiber preform fully immersed in a nanoparticle suspension having nanoparticles, in accordance with various embodiments.
Figure 2B:
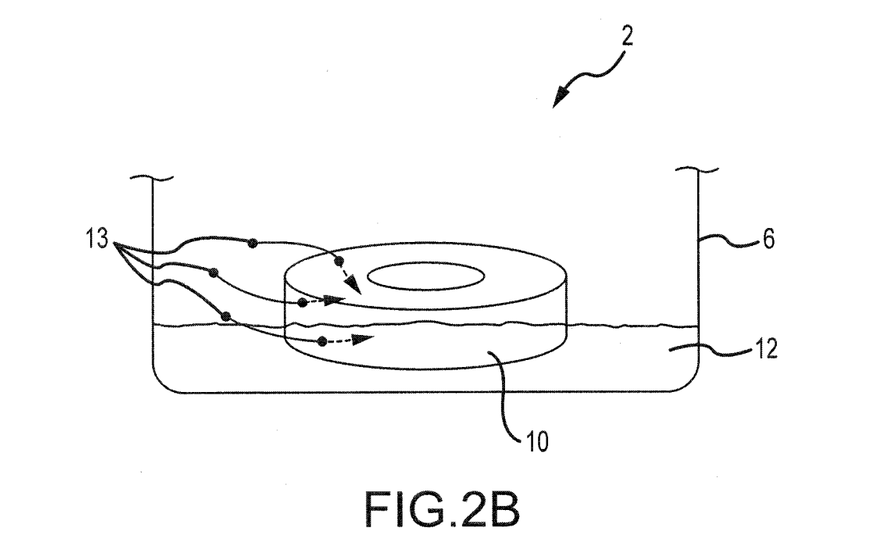
FIG. 2B comprises a detail view of various aspects of an example system for ceramic doping, including a carbon fiber preform partially immersed in a nanoparticle suspension having nanoparticles, in accordance with various embodiments.
Figure 3:
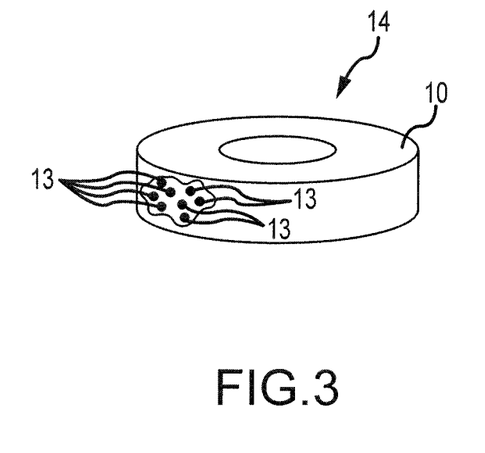
FIG. 3 comprises a diagram of an example doped carbon fiber preform, in accordance with various embodiments.

With reference to FIGS. 2A-B, the nanoparticle suspension 12 may comprise a nanoparticle dispersion. The nanoparticle suspension 12 may comprise nanoparticles 13 such as aluminum oxide nanoparticles. Alternatively, the nanoparticle suspension 12 may comprise any other desired nanoparticles 13, for example, nanoparticles 13 comprising a different oxide. Furthermore, the nanoparticles 13 may be dispersed in a dispersion medium. In various embodiments, the dispersion medium comprises water, although any other suitable dispersion medium may be contemplated. In various embodiments, the nanoparticle suspension 12 comprises a nanoparticle dispersion of aluminum oxide nanoparticles in an aqueous medium, for example, Nanobyk® available from Altana of Wesel, Germany. During various processes discussed further herein, the nanoparticles 13 may migrate from the dispersion medium and into the carbon fiber preform 10, as shown in FIGS. 2A-B. With reference to FIG. 3, at the conclusion of various processes discussed further herein, the nanoparticles 13 may be interspersed throughout the carbon fiber preform 10. Thus, the nanoparticles 13 may be combined with a carbon fiber preform 10 to comprise a doped carbon fiber preform 14.

Figure 4:
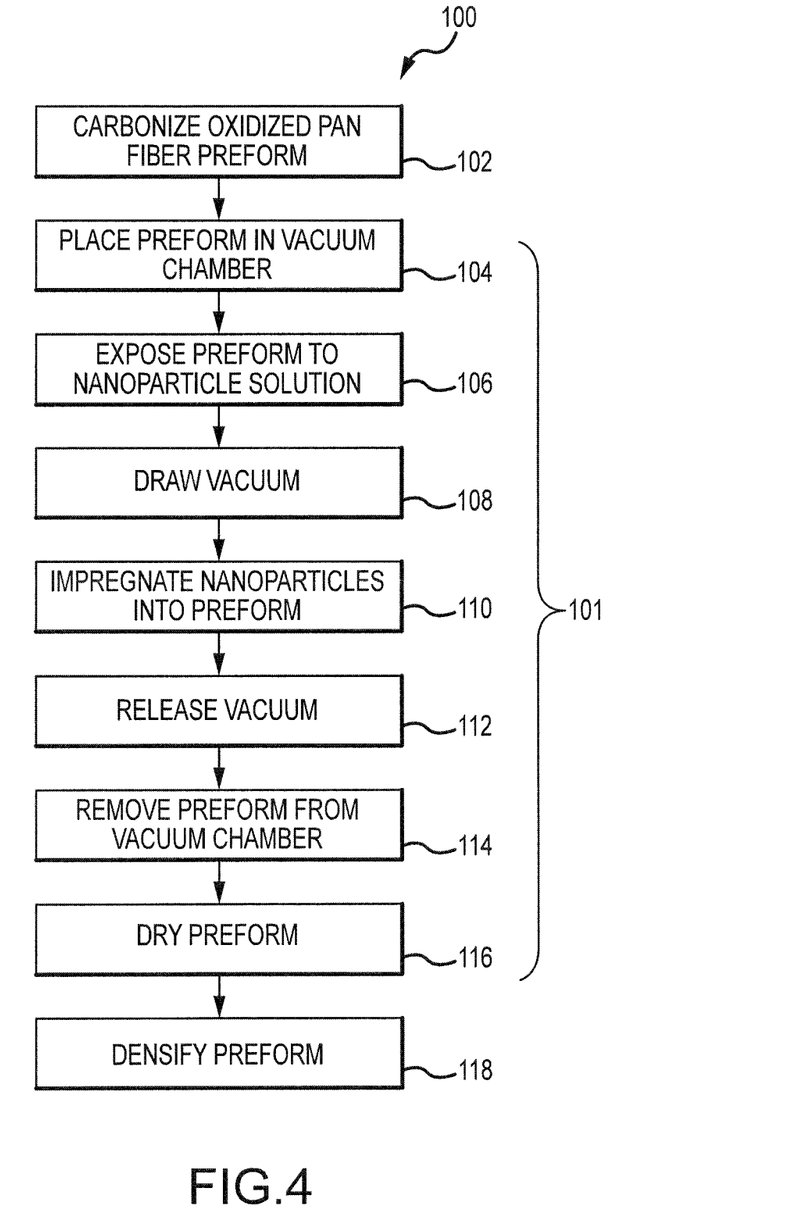
FIG. 4 illustrates a flowchart of various steps of an example process for ceramic doping of a carbon fiber preform under vacuum, in accordance with various embodiments.

Having discussed various systems for ceramic doping, renewed attention is directed to FIG. 1 and additional attention is directed to FIG. 4, wherein a method 100 of processing a carbon fiber preform 10 is disclosed. In various embodiments, a preform comprising oxidized PAN fibers is carbonized as previously discussed, thus making a carbon fiber preform 10 (Step 102). Subsequently the carbon fiber preform 10 is subjected to a method 101 for ceramic doping, turning the carbon fiber preform 10 into a doped carbon fiber preform 14. Subsequently, the doped carbon fiber preform 14 is densified (Step 118).

The method 101 for ceramic doping may comprise steps. For example, the carbon fiber preform 10 may be placed in a vacuum chamber 6. (Step 104). A nanoparticle suspension 12 is also placed in the vacuum chamber 6, so that the carbon fiber preform 10 is exposed to the nanoparticle suspension 12 (Step 106). While the carbon fiber preform 10 is exposed to the nanoparticle suspension 12, a vacuum is drawn within the vacuum chamber 6 by the vacuum source 4 (Step 108). In various embodiments, the vacuum pressure comprises a first vacuum pressure. The first vacuum pressure may comprise about 15 mmHg (133 Pa). In further embodiments, the first vacuum pressure may comprise any desired vacuum pressure. In various embodiments, the first vacuum pressure is maintained for a first duration of time. The first duration of time may comprise a period of approximately 30 minutes, such as in embodiments implementing a 25% nanoparticle solution by weight. However, the first duration of time may comprise different durations contemplated for different percent nanoparticle solutions and for different desired levels of doping. Thus, any desired period may be selected. The vacuum pressure facilitates the impregnation of nanoparticles 13 (FIGS. 2A-B) from the nanoparticle suspension 12 and into the carbon fiber preform 10 (Step 110). Once the carbon fiber preform 10 is doped with a desired amount of nanoparticles 13, the vacuum source 4 releases the vacuum pressure from the vacuum chamber 6 (Step 112). At this point, the carbon fiber preform 10 has thus been converted into a doped carbon fiber preform 14 (FIG. 3), having nanoparticles 13 disposed throughout its body. As such, the doped carbon fiber preform 14 (FIG. 3) is removed from the vacuum chamber 6 (Step 114). The doped carbon fiber preform 14 (FIG. 3) may further comprise dispersion medium from the nanoparticle suspension 12. The doped carbon fiber preform 14 (FIG. 3) may be dried, to remove this dispersion medium, thus leaving only the nanoparticles 13 (Step 116). In various embodiments, the doped carbon fiber preform 14 is dried at a first temperature until the dispersion medium is removed and/or substantially removed. In various embodiments, the first temperature comprises 260-316 degrees Celsius, although in further embodiments, different desired temperatures may be implemented depending on the type of dispersion medium implemented. Such doping may in various embodiments protect the doped carbon fiber preform 14 from oxidation, by creating a substantially crack-free film of dopant on the doped carbon fiber preform 14 whereby oxidation is inhibited. Furthermore, such doping may fill pores of the doped carbon fiber preform 14 with nanoparticles 13, thus increasing the density of the doped carbon fiber preform 14.

In various embodiments, the doped carbon fiber preform 14 is subsequently densified (Step 118). In various embodiments, the densification step 118 comprises thermal gradient CVI. However, in further embodiments, the densification step 118 comprises traditional CVI.

The duration of time during which the doped carbon fiber preform 14 undergoes densification is reduced compared to that of carbon fiber preforms that have not been doped according to the method 101 for ceramic doping. This is because the method 101 for ceramic doping increases the density of the doped carbon fiber preform 14.

Thus, doped carbon fiber preforms 14 (FIG. 3) are associated with fewer process cycles to reach a commercially acceptable density of 1.80 g/cm$^3$ (+/− about 0.10 g/cm$^3$) versus undoped preforms, and in various embodiments, higher final densities versus undoped carbon fiber preforms may be achieved. As such, in response to the method 101, the densification step 118 may be shortened versus undoped carbon fiber preforms, so that the duration of time during which the doped carbon fiber preform 14 undergoes densification (Step 118) is reduced. For example, while prior art carbon fiber preforms may have required densification processing times (Step 118) of up to 60-90 days to form the (final, post-densifying) doped carbon fiber preform 14 without undergoing method 101, by implementing the method 101, and further by implementing thermal gradient CVI, the densification processing time (Step 118) may be cut to approximately less than one week.

Figure 5:
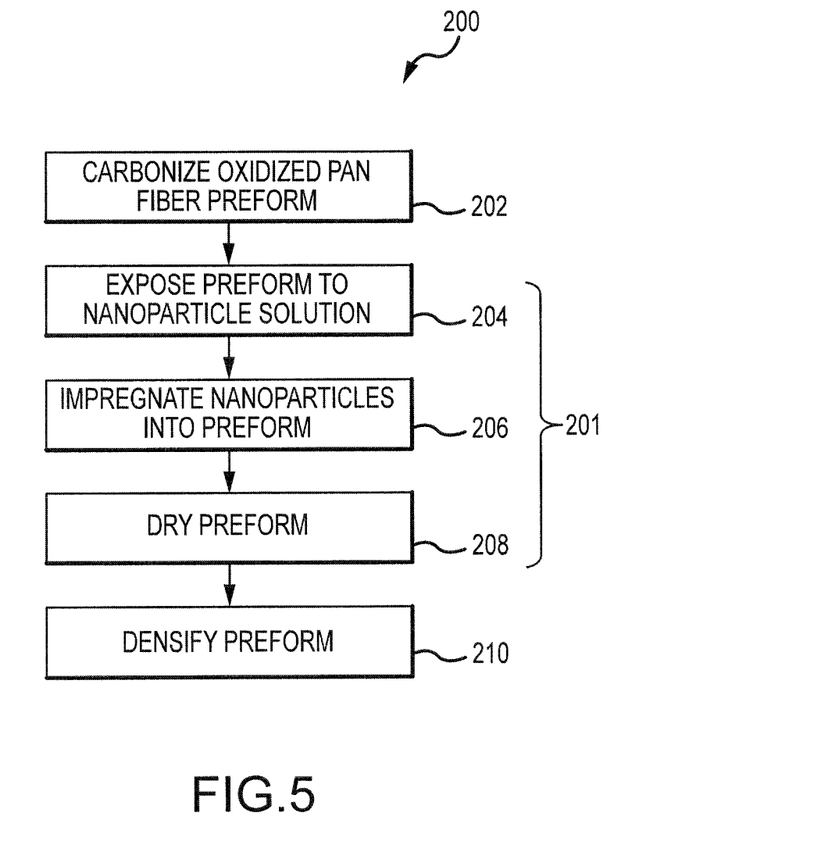
FIG. 5 illustrates a flowchart of various steps of an example process for ceramic doping of a carbon fiber preform, in accordance with various embodiments.

With reference now to FIGS. 1 and 5, method 200 of processing a carbon fiber preform 10 is disclosed. In various embodiments, a preform comprising oxidized PAN fibers is carbonized as previously discussed, thus making a carbon fiber preform 10 (Step 202). Subsequently the carbon fiber preform 10 is subjected to a method 201 for ceramic doping, turning the carbon fiber preform 10 into a doped carbon fiber preform 14. Subsequently, the doped carbon fiber preform 14 is densified (Step 210).

The method 201 for ceramic doping may be similar to the method 101 (FIG. 4) for ceramic doping, except that no vacuum is employed. For example, the carbon fiber preform 10 is exposed to the nanoparticle suspension 12 (Step 204). The nanoparticles 13 (FIGS. 2A-B) from the nanoparticle suspension 12 migrate into the carbon fiber preform 10 by diffusion, impregnating the carbon fiber preform 10 with nanoparticles 13 (Step 206). Once the carbon fiber preform 10 is doped with a desired amount of nanoparticles 13, the carbon fiber preform 10 has thus been converted into a doped carbon fiber preform 14 (FIG. 3), having nanoparticles 13 disposed throughout its body. The doped carbon fiber preform 14 (FIG. 3) may further comprise dispersion medium from the nanoparticle suspension 12. The doped carbon fiber preform 14 (FIG. 3) may be dried, to remove this all and/or substantially all of this dispersion medium, thus leaving only the nanoparticles 13 (Step 208). In various embodiments, the doped carbon fiber preform 14 is dried at a first temperature until the dispersion medium is removed. In various embodiments, the first temperature comprises 260-316 degrees Celsius, although in further embodiments, different desired temperatures may be implemented depending on the type of dispersion medium implemented. Such doping may in various embodiments protect the doped carbon fiber preform 14 from oxidation, by creating a substantially crack-free film of dopant on the doped carbon fiber preform 14 whereby oxidation is inhibited. Furthermore, such doping may fill pores of the doped carbon fiber preform 14 with nanoparticles 13, thus increasing the density of the doped carbon fiber preform 14, as discussed.

In various embodiments, the doped carbon fiber preform 14 is subsequently densified (Step 210). In various embodiments, the densification step 210 comprises thermal gradient CVI. However, in further embodiments, the densification step 210 comprises traditional CVI.

The duration of time during which the doped carbon fiber preform 14 undergoes densification is reduced compared to that of carbon fiber preforms that have not been doped according to the method 210 for ceramic doping. This is because the method 201 for ceramic doping increases the density of the doped carbon fiber preform 14.

Thus, doped carbon fiber preforms 14 (FIG. 3) are associated with fewer process cycles to reach a commercially acceptable density of 1.8 g/cm$^3$ (+/-about 0.10 g/cm$^3$) versus undoped preforms, and in various embodiments, higher final densities versus undoped carbon fiber preforms may be achieved. As such, in response to the method 201, the densification step 210 may be shortened versus undoped carbon fiber preforms, so that the duration of time during which the doped carbon fiber preform 14 undergoes densification (Step 210) is reduced. For example, while prior art carbon fiber preforms may have required densification processing times (Step 210) of up to 60-90 days to form the (final, post-densifying) doped carbon fiber preform 14 without undergoing method 201, by implementing the method 201, and further by implementing thermal gradient CVI, the densification processing time (Step 210) may be cut to approximately less than one week.

While the systems described herein have been described in the context of aircraft brake applications; however, one will appreciate in light of the present disclosure, that the systems described herein may be used in various other applications involving carbon fiber preforms, for example, different vehicle applications, such as cars, trucks, busses, trains, boats, and submersible vehicles, space vehicles including manned and unmanned orbital and sub-orbital vehicles, or any other vehicle or device, or in connection with industrial processes, or tools, or machinery or any other system or process having need for carbon fiber parts, such as brake parts.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of processing a carbon fiber preform comprising:
    carbonizing a fibrous preform comprising oxidized PAN fibers to form the carbon fiber preform;
    placing the carbon fiber preform in a vacuum chamber;
    exposing the carbon fiber preform to a nanoparticle dispersion comprising a nanoparticle and a dispersion medium, wherein the nanoparticle comprises aluminum oxide nanoparticles;
    drawing an at least partial vacuum within the vacuum chamber by a vacuum source for a first duration of time and at a first vacuum pressure to facilitate impregnating the nanoparticle into the carbon fiber preform, whereby the carbon fiber preform is converted into a doped carbon fiber preform; and
    drying the doped carbon fiber preform at a first temperature whereby the dispersion medium is at least one of substantially removed or completely removed from the doped carbon fiber preform.

2. The method according to claim 1, wherein the first temperature comprises about 260° C. to 316° C.

3. The method according to claim 1, further comprising densifying the doped carbon fiber preform.

4. The method according to claim 3, wherein the impregnating occurs prior to the densifying.

5. The method according to claim 3, wherein the densifying comprises chemical vapor infiltration ("CVI").

6. The method of processing a carbon fiber preform according to claim 1, wherein the first duration of time comprises about 30 minutes.

7. The method of processing a carbon fiber preform according to claim 1, wherein the first vacuum pressure comprises about 15 mmHg.

8. The method of processing a carbon fiber preform according to claim 3, wherein the densifying comprises thermal gradient CVI.

\* \* \* \* \*